(12) United States Patent
Zhang et al.

(10) Patent No.: US 10,566,555 B2
(45) Date of Patent: Feb. 18, 2020

(54) ORGANIC LIGHT EMITTING DIODE (OLED) DISPLAY PANEL AND THE MANUFACTURING METHOD THEREOF

(71) Applicant: Wuhan China Star Optoelectronics Semiconductor Display Technology Co., Ltd., Wuhan, Hubei (CN)

(72) Inventors: Ming Zhang, Hubei (CN); Jie Yang, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/023,419

(22) Filed: Jun. 29, 2018

(65) Prior Publication Data

US 2019/0237687 A1    Aug. 1, 2019

Related U.S. Application Data

(63) Continuation of application No. PCT/CN2018/078852, filed on Mar. 13, 2018.

(30) Foreign Application Priority Data

Jan. 30, 2018   (CN) .......................... 2018 1 0088923

(51) Int. Cl.
*H01L 51/00*    (2006.01)
*H01L 51/52*    (2006.01)
*H01L 27/32*    (2006.01)

(52) U.S. Cl.
CPC ...... *H01L 51/0097* (2013.01); *H01L 27/3244* (2013.01); *H01L 51/5221* (2013.01); *H01L 51/5237* (2013.01); *H01L 2227/323* (2013.01); *H01L 2251/5338* (2013.01)

(58) Field of Classification Search
CPC .................................................... H01L 27/3244
See application file for complete search history.

(56) References Cited

U.S. PATENT DOCUMENTS

| | | | |
|---|---|---|---|
| 2017/0170206 A1* | 6/2017 | Lee | H01L 27/1218 |
| 2017/0194404 A1* | 7/2017 | Park | H01L 27/3262 |
| 2018/0005568 A1* | 1/2018 | Kim | G09G 3/3208 |
| 2018/0033979 A1* | 2/2018 | Jang | H01L 51/56 |
| 2018/0294328 A1* | 10/2018 | Kanaya | H01L 27/3276 |

* cited by examiner

*Primary Examiner* — Grant S Withers
(74) *Attorney, Agent, or Firm* — Leong C. Lei

(57) ABSTRACT

The present disclosure relates to a OLED display panel and the manufacturing method thereof. The OLED display panel includes a carrier substrate, a flexible substrate formed on the carrier substrate, a TFT layer formed on the flexible substrate, an organic emission layer formed on the TFT layer, and a cathode formed on the TFT layer and the organic emission layer. The flexible substrate is configured with at least one first groove exterior to a border of the cathode, and the TFT layer is configured with at least one second groove corresponding to the first groove. The second groove is configured to collect particles generated when the cathode is applied with an evaporation process. In this way, the packaging reliability may be enhanced.

6 Claims, 4 Drawing Sheets

ORGANIC LIGHT EMITTING DIODE (OLED) DISPLAY PANEL AND THE MANUFACTURING METHOD THEREOF

CROSS REFERENCE TO RELATED APPLICATIONS

This application is a continuing application of PCT Patent Application No. PCT/CN2018/078852, entitled "OLED DISPLAY PANEL AND THE MANUFACTURING METHOD THEREOF", filed on Mar. 13, 2018, which claims priority to Chinese Patent Application No. 201810088923.5, filed on Jan. 30, 2018, both of which are hereby incorporated in its entireties by reference.

BACKGROUND

1. Technical Field

The present disclosure relates to display technology field, and more particularly to an OLED display panel and the manufacturing method thereof.

2. Description of Related Art

OLEDs have been favored by the public and developers due to the attributes, such as, self-luminous, high contrast, wide viewing angle, low power consumption, and bendability. Flexible OLEDs also gradually occupy the market because of their flexible, thin and light features. Flexible OLEDs generally adopt thin film encapsulation (TFE). There are a variety of factors that may impact the performance of the flexible package, such as film quality, thickness, and a border of the packaging film itself, in particular, particles.

At present, the manufacturing process of the flexible OLED may have several phases, including Array, OLED evaporation, and TFE. As shown in FIG. 1, the cathode 10' may use Mg:Ag in evaporation. When the metal is co-evaporated, the particles 12' are easily produced by the peeling of the Mg:Ag film in the evaporation process. At the same time, the particles 12' are generated in the outline where the cathode mask 11' contacts with the panel.

The TFE mainly relies on the inorganic layer to block water and oxygen and planarization of the organic layer, and is formed by laminating layers of the inorganic layer and the organic layer. With respect to the particles generated in the process of cathode deposition, because its position is concentrated on the edge of the panel, the impact on the packaging effect is very obvious, which may reduce the reliability of the package.

SUMMARY

The present disclosure relates to propose an OLED display panel and the manufacturing method thereof to enhance the package reliability.

In one aspect, an organic light emitting diode (OLED) display panel includes: a carrier substrate; a flexible substrate formed on the carrier substrate; a thin film 2) transistor (TFT) layer formed on the flexible substrate; an organic emission layer formed on the TFT layer; a cathode formed on the TFT layer and the organic emission layer; the flexible substrate being configured with at least one first groove exterior to a border of the cathode, and the TFT layer being configured with at least one second groove corresponding to the first groove, and the second groove being configured to collect particles generated when the cathode is applied with an evaporation process.

The display panel further includes: a packaging film formed on the TFT layer, the organic emission layer, and the cathode, and the first groove and the second groove are between a projection of a border of the packaging film on the flexible substrate and between the border of the cathode on the flexible substrate.

Wherein a projection of the second groove on the flexible substrate overlaps with the first groove.

Wherein the first groove is a ring-shaped groove surrounding the cathode.

Wherein a depth of the first groove and a depth of the second groove is ⅓ to ⅔ of the thickness of the flexible substrate.

Wherein the thickness of the flexible substrate in a range from 1 to 50 mm.

Wherein a width of the first groove and the second groove is greater than 10 mm.

In another aspect, a manufacturing method of OLED display panel includes: providing a carrier substrate; forming a flexible substrate on the carrier substrate, and forming at least one first groove on a predetermined location on the flexible substrate; forming a TFT layer on the flexible substrate, forming at least one second groove on the TFT layer, and the second groove correspond to the first groove; forming an organic emission layer on the TFT layer; and applying an evaporation process to a cathode on the TFT layer and the organic emission layer, collecting particles generated when the cathode is applied with the evaporation process by the second groove, and the first groove and the second groove are exterior to a border of the cathode.

Wherein the step of forming the first groove on a predetermined location on the flexible substrate further includes: coating photoresist material on the flexible substrate to form a photoresist layer; applying a pattern process having exposing and developing sub-processes to the photoresist layer to form a plurality of first photoresist regions and a plurality of second photoresist regions, the first photoresist regions and the second photoresist regions are spaced apart from each other, and the first photoresist regions and the second photoresist are alternately arranged, and an interval spacer is formed between the first photoresist region and the second photoresist region; the first photoresist regions and the second photoresist regions operate as masks during an etching process toward the flexible substrate, and the first groove is formed in accordance with a location of the internal spacer.

Wherein the method further includes: forming a packaging film on the TFT layer, the organic emission layer, and the cathode, and the first groove and the second groove are between a projection of a border of the packaging film on the flexible substrate and between the border of the cathode on the flexible substrate.

In view of the above, the first grooves are formed on flexible substrate having a greater thickness, and the first grooves are exterior to the border of the cathode. The TFT layer is then formed on the flexible substrate having the first groove. The TFT layer is configured with the second groove corresponding to the first groove such that the second groove may collect the particles generated during the cathode is applied with the evaporation process. In this way, the packaging reliability may be enhanced.

DETAILED DESCRIPTION

Following embodiments of the invention will now be described in detail hereinafter with reference to the accompanying drawings.

Figure 1:
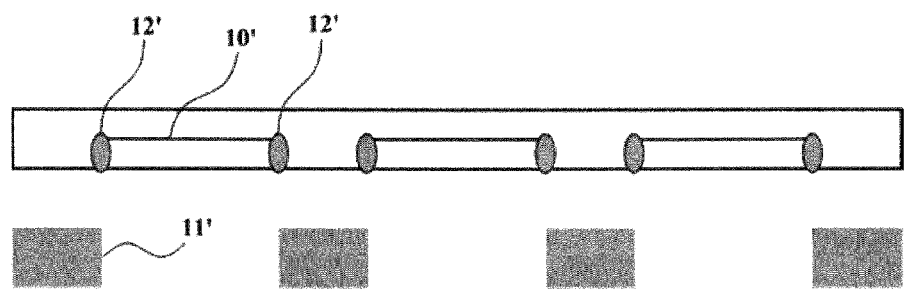
FIG. 1 is a schematic view showing the particles generated when a cathode of a conventional OLED display panel is evaporated.
Figure 2:
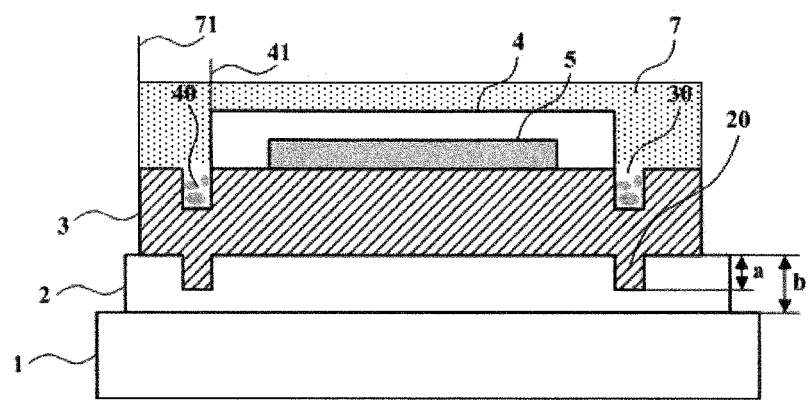
FIG. 2 is a schematic view of the OLED display panel in accordance with a first embodiment of the present disclosure.

FIG. 2 is a schematic view of the OLED display panel in accordance with a first embodiment of the present disclosure. The OLED display panel includes a carrier substrate 1, a flexible substrate 2 formed on the carrier substrate 1, a thin film transistor (TFT) layer 3 formed on the flexible substrate 2, an organic emission layer 5 formed on the TFT layer 3, and a cathode 4 formed on the TFT layer 3 and the organic emission layer 5. At least one first groove 20 is configured on the flexible substrate 2, and the first groove is exterior to the border 41 of the cathode 4. At least one second grooves 30 is configured on the TFT layer 3 at a location corresponding to the first grooves 20. The second groove 30 is configured to collect the particles 40 generated by the cathode 4 during the evaporation process.

The technical solution to reduce the impact caused by the particles 40 toward the package reliability relates to configure the grooves for collecting the particles 40. Considering the thickness of the film layer, such as PI) of the flexible substrate 2, the depth of the grooves has to be configured. During the manufacturing process of the flexible substrate 2, the step of forming the first groove 20 is included, such that the first groove 20 is exterior to the border 41 of the cathode 4. During the manufacturing process of the TFT layer 3, the step of forming the second groove 30 is included, such that the second groove 30 is formed at a location corresponding to the first groove 20. In this way, when the cathode 4 is evaporated, the generated particles 40 may be collected by the second groove 30, which reduces the impact toward the packaging. At the same time, the mask edge of the cathode 4 is also prevented from being directly contacted with the TFT layer 3. It is to be noted that the locations of the second groove 30 correspond to the locations of the first groove 20, which means that a projection of the second groove 30 on the flexible substrate 2 overlaps with the first groove 20.

Figure 3:
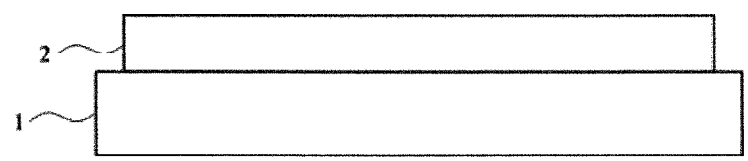
FIGS. 3-8 are schematic views showing the manufacturing process of the OLED display panel in accordance with one embodiment of the present disclosure.
Figure 4:
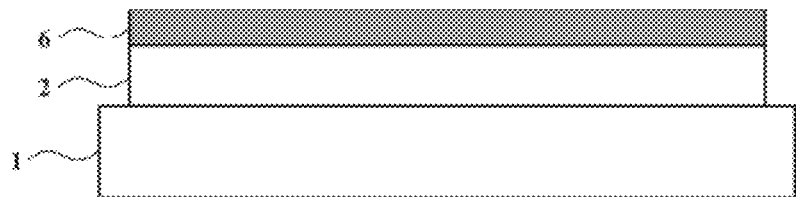
Figure 5:
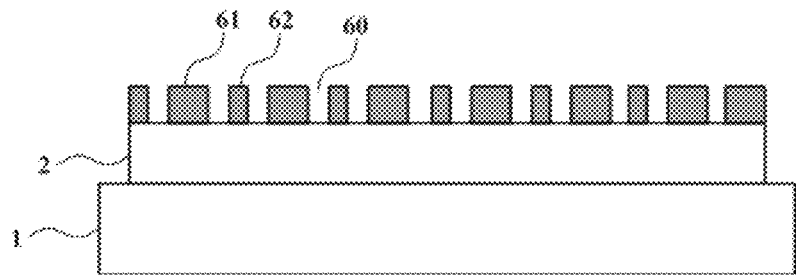
Figure 6:
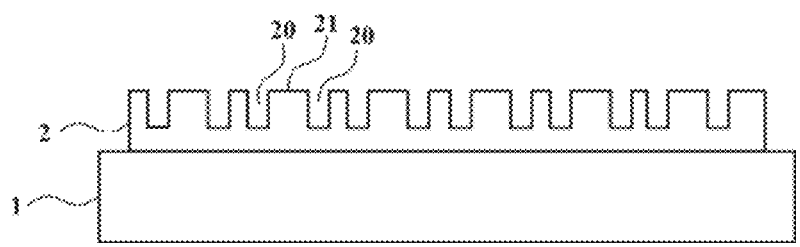
Figure 7:
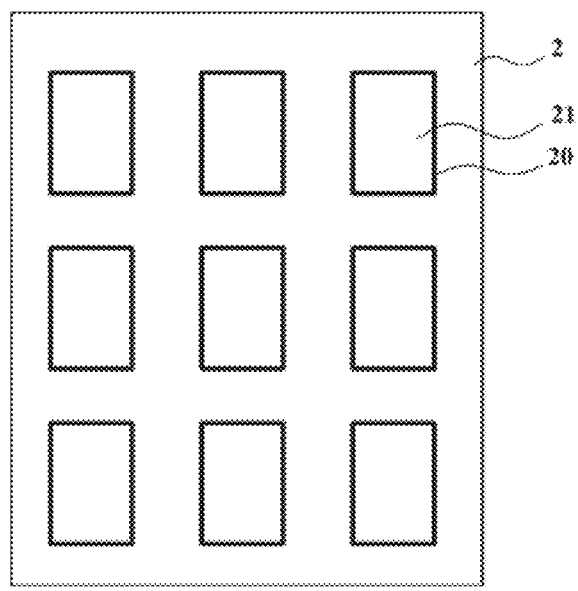

FIGS. 3-8 are schematic views showing the manufacturing process of the OLED display panel in accordance with one embodiment of the present disclosure. Referring to FIG. 3, the carrier substrate 1, after being cleaned, is coated with polymers, such as PI, to form the flexible substrate 2. The thickness of the flexible substrate 2 in a range from 1 to 50 mm. As shown in FIG. 4, the flexible substrate 2 is coated with photoresist material to form a photoresist layer 6. As shown in FIG. 5, the photoresist layer 6 is subjected to a patterning process, including exposing and developing processes, to form a plurality of first photoresist regions 61 and a plurality of second photoresist regions 62 that are spaced apart and are alternately arranged, and an interval spacer 60 is formed between the first photoresist region 61 and the second photoresist region 62. A width of the first photoresist region 61 is greater than a width of the second photoresist region 62. As shown in FIG. 6, the first photoresist regions 61 and the second photoresist regions 62 are masks for etching the flexible substrate 2, and the first groove 20 are formed at the location corresponding to the interval spacers 60. It is to be noted that when the photoresist layer 6 is subjected to the patterning process, including the exposing and developing processes, the first photoresist regions 61 may be formed in accordance with the cathode to be evaporated. In this way, As shown in FIG. 6, during the etching process, a first area 21, which corresponds to the location where the cathode to be evaporated is disposed, is formed on the flexible substrate 2, and the first groove 20 exterior to a border of the first area 21 is formed. The border of the first area 21 is the border of the cathode to be evaporated. FIG. 7 is a plan view of the flexible substrate 2 having the first groove 20. The first groove 20 is a ring-shaped groove surrounding the first photoresist regions 61. A width of the first groove 20 is greater than 10 mm, and a depth of the first groove 20 (hereinafter referred to as "a") is ⅓ to ⅔ of the thickness of the flexible substrate 2 (hereinafter referred to as "b".) That is, a=(⅓~⅔)b.

Figure 8:
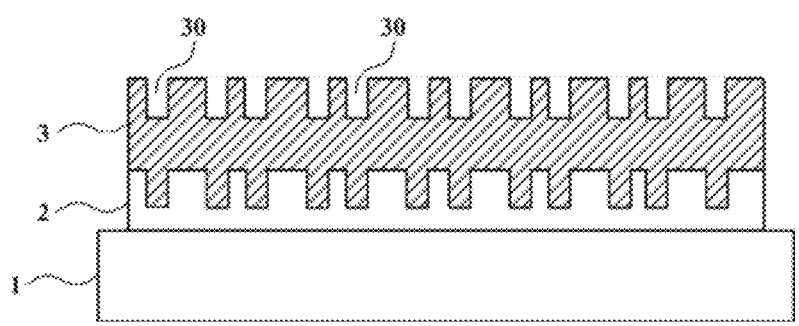

As shown in FIG. 8, the flexible substrate 2 having the first groove 20 formed there on is then subjected to the remaining TFT manufacturing process. Generally, the TFT layer 3 is formed on the flexible substrate 2, and the organic emission layer 5 is formed on the TFT layer 3 to form the structure as shown in FIG. 2. Due to the first groove 20, the second groove 30 is formed at the location corresponding to the first groove 20. Thus, during the evaporation process, the second groove 30 is configured to collect the particles. In addition to the location corresponding to the first groove 20, the width of the second groove 30 is also greater than 10 mm, and the depth of the second groove 30 is also ⅓ to ⅔ of the thickness of the flexible substrate 2. The packaging film is formed on the TFT layer 3, the organic emission layer 5 and the cathode 4. Further, as shown in FIG. 2, the first groove 20 and the second groove 30 are between a projection of a border 71 of the packaging film on the flexible substrate 2 and between a border 41 of the cathode 4 on the flexible substrate 2. As such, the packaging film may cover the second groove 30 configured to collect the particles 40 generated during the evaporation process applied to the cathode 4.

Figure 9:
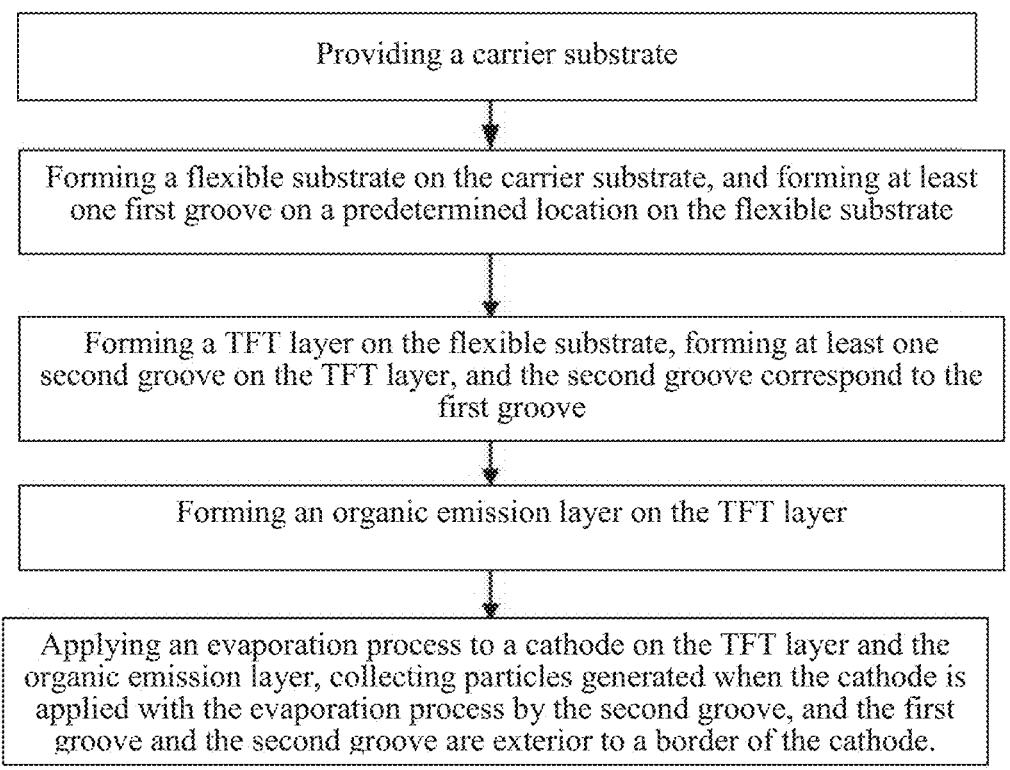
FIG. 9 is a flowchart illustrating the manufacturing method of the OLED display panel in accordance with a second embodiment of the present disclosure.

FIG. 9 is a schematic view of the OLED display panel in accordance with a second embodiment of the present disclosure.

The OLED display panel includes: a carrier substrate and a flexible substrate formed on the carrier substrate. The first groove is formed on a predetermined location on the flexible substrate. The TFT layer is formed on the flexible substrate. The second groove are formed on the TFT layer, and the locations of the second groove 30 correspond to the first groove. The organic emission layer is formed on the TFT layer. The evaporation process is applied to the cathode on the TFT layer and the organic emission layer, and the second groove is configured to collect the particles generated by the cathode during the evaporation process. The first groove and the second groove are exterior to the border of the cathode.

As shown in FIGS. 3-8, the carrier substrate 1, after being cleaned, is coated with polymers, such as PI, to form the flexible substrate 2. The thickness of the flexible substrate 2 in a range from 1 to 50 mm. The flexible substrate 2 is coated with photoresist material to form a photoresist layer 6. The photoresist layer 6 is subjected to a patterning process, including exposing and developing processes, to form a plurality of first photoresist regions 61 and a plurality of second photoresist regions 62 that are spaced apart, and an interval spacer 60 is formed between the first photoresist region 61 and the second photoresist region 62. A width of the first photoresist region 61 is greater than a width of the second photoresist region 62. The first photoresist regions 61 and the second photoresist regions 62 are masks for etching the flexible substrate 2, and the first groove 20 is formed at the locations corresponding to the interval spacers 60. It is to be noted that when the photoresist layer 6 is subjected to the patterning process, including the exposing and developing processes, the first photoresist regions 61 may be formed in accordance with the cathode to be evaporated. As shown in FIG. 6, during the etching process, a first area 21, which corresponds to the location where the cathode to be evaporated is disposed, is formed on the flexible substrate 2, and the first groove 20 exterior to the first area 21 is formed. The border of the first area 21 is the border of the cathode to be evaporated. The flexible substrate 2 having the first groove 20 formed thereon is then subjected to the remaining TFT manufacturing process. Generally, the TFT layer 3 is formed on the flexible substrate 2, and the organic emission layer 5 is formed on the TFT layer 3 to form the structure as shown in FIG. 2. Due to the first groove 20, the second groove 30 are formed at the location corresponding to the first groove 20. Thus, during the evaporation process, the second groove 30 is configured to collect the particles. It is to be noted that the location of the second groove 30 correspond to the location of the first grooves 20, which means that the projections of the second groove 30 on the flexible substrate 2 overlap with the first groove 20. The packaging film is formed on the TFT layer 3, the organic emission layer 5 and the cathode 4. Further, as shown in FIG. 2, the first groove 20 and the second groove 30 are between a projection of a border 71 of the packaging film on the flexible substrate 2 and between a border 41 of the cathode 4 on the flexible substrate 2. As such, the packaging film may cover the second groove 30 configured to collect the particles 40 generated during the evaporation process applied to the cathode 4.

In view of the above, the first grooves are formed on flexible substrate having a greater thickness, and the first grooves are exterior to the border of the cathode. The TFT layer is then formed on the flexible substrate having the first groove. The TFT layer is configured with the second groove corresponding to the first groove such that the second groove may collect the particles generated during the cathode is applied with the evaporation process. In this way, the packaging reliability may be enhanced.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. An organic light emitting diode (OLED) display panel, comprising:
    a carrier substrate;
    a flexible substrate formed on the carrier substrate;
    a thin film transistor (TFT) layer formed on the flexible substrate;
    an organic emission layer formed on the TFT layer;
    a cathode formed on the TFT layer and the organic emission layer;
    the flexible substrate being configured with at least one first groove exterior to a border of the cathode, and the TFT layer being configured with at least one second groove corresponding to the first groove, and the second groove being configured to collect particles generated when the cathode is applied with an evaporation process; and
    a packaging film formed on the TFT layer, the organic emission layer, and the cathode, and the first groove and the second groove are between a projection of a border of the packaging film on the flexible substrate and a projection of a border of the cathode on the flexible substrate.

2. The OLED display panel as claimed in claim 1, wherein a projection of the second groove on the flexible substrate overlaps with the first groove.

3. The OLED display panel as claimed in claim 1, wherein the first groove is a ring-shaped groove surrounding the cathode.

4. The OLED display panel as claimed in claim 1, wherein a depth of the first groove and a depth of the second groove is ⅓ to ⅔ of the thickness of the flexible substrate.

5. The OLED display panel as claimed in claim 4, wherein the thickness of the flexible substrate in a range from 1 to 50 mm.

6. The OLED display panel as claimed in claim 4, wherein a width of the first groove and the second groove is greater than 10 mm.

* * * * *